US011621503B2

(12) United States Patent
Uchida et al.

(10) Patent No.: US 11,621,503 B2
(45) Date of Patent: Apr. 4, 2023

(54) SUBSTRATE UNIT

(71) Applicants: AutoNetworks Technologies, Ltd., Mie (JP); Sumitomo Wiring Systems, Ltd., Mie (JP); SUMITOMO ELECTRIC INDUSTRIES, LTD., Osaka (JP)

(72) Inventors: Koki Uchida, Mie (JP); Arinobu Nakamura, Mie (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 15/778,821

(22) PCT Filed: Jun. 7, 2017

(86) PCT No.: PCT/JP2017/021201
§ 371 (c)(1),
(2) Date: May 24, 2018

(87) PCT Pub. No.: WO2017/213195
PCT Pub. Date: Dec. 14, 2017

(65) Prior Publication Data
US 2019/0214745 A1    Jul. 11, 2019

(30) Foreign Application Priority Data

Jun. 9, 2016  (JP) .............................. JP2016-115543

(51) Int. Cl.
*H01R 4/34*    (2006.01)
*H01R 4/30*    (2006.01)
(Continued)

(52) U.S. Cl.
CPC ............... *H01R 4/305* (2013.01); *H01R 4/34* (2013.01); *H01R 12/53* (2013.01);
(Continued)

(58) Field of Classification Search
CPC ...... H01R 4/305; H01R 43/205; H01R 12/53; H01R 4/308; H05K 5/0052; H05K 5/0247; H05K 5/0069
See application file for complete search history.

(56) References Cited

U.S. PATENT DOCUMENTS 5,215,477 A * 6/1993 Weber .................... H01R 24/52
                                                        439/581
6,000,960 A * 12/1999 Wang ................. H01R 12/7005
                                                        439/327
(Continued)

FOREIGN PATENT DOCUMENTS

JP    2011-234427 A    11/2011
JP    2015-042109 A     3/2015

OTHER PUBLICATIONS

Search Report for PCT/JP2017/021201, dated Jul. 4, 2017.

*Primary Examiner* — Truc T Nguyen
(74) *Attorney, Agent, or Firm* — Honigman LLP

(57) ABSTRACT

Provided is a substrate unit including a case accommodating a circuit board; a bus bar electrically connected to the circuit board, and includes an extending portion extending out of the case; and an external thread portion for electrically connecting the extending portion to a connection terminal of a wire harness, the external thread portion including a shaft portion with an external thread, and a head portion that is noncircular, and protrudes at one end portion of the shaft portion in a radial direction of the shaft portion, wherein the case includes a fitting recess to which the head portion is fitted by sliding the external thread portion in a direction intersecting an axial direction of the external thread portion, (Continued)

and that has an abutment surface by which the head portion is stopped, and, at least on the two sides of the abutment surface, relief recesses that define a gap.

7 Claims, 6 Drawing Sheets

(51) Int. Cl.
| | |
|---|---|
| *H01R 12/70* | (2011.01) |
| *H01R 12/53* | (2011.01) |
| *H01R 43/20* | (2006.01) |
| *H05K 5/00* | (2006.01) |
| *H05K 5/02* | (2006.01) |
| *H01R 25/16* | (2006.01) |
| *H01R 9/24* | (2006.01) |

(52) U.S. Cl.
CPC ....... *H01R 12/7088* (2013.01); *H01R 43/205* (2013.01); *H05K 5/0052* (2013.01); *H05K 5/0069* (2013.01); *H05K 5/0247* (2013.01); *H01R 4/308* (2013.01); *H01R 9/2416* (2013.01); *H01R 25/16* (2013.01)

(56) References Cited

U.S. PATENT DOCUMENTS

| | | | |
|---|---|---|---|
| 6,692,314 B1* | 2/2004 | Pares Caselles | H01R 9/18 439/521 |
| 6,696,914 B2* | 2/2004 | Haupt | H01H 85/0241 337/187 |
| 10,170,900 B2* | 1/2019 | Yamane | H02G 3/16 |
| 2004/0084600 A1* | 5/2004 | Kanou | F16B 5/02 248/500 |
| 2010/0319985 A1* | 12/2010 | Trimpe | H02G 3/083 174/520 |
| 2013/0028683 A1 | 1/2013 | I et al. | |
| 2019/0067841 A1* | 2/2019 | Nagano | H01R 4/34 |
| 2021/0226358 A1* | 7/2021 | Yamamoto | H01R 4/302 |

\* cited by examiner

421n: 421na, 421b, 421nc

SUBSTRATE UNIT

This application is the U.S. national stage of PCT/JP2017/021201 filed Jun. 7, 2017, which claims priority of Japanese Patent Application No. JP 2016-115543 filed Jun. 9, 2016.

TECHNICAL FIELD

The present invention relates to a substrate unit.

This application is based upon and claims the benefit of priority from the corresponding Japanese Patent Application No. 2016-115543 filed on Jun. 9, 2016, the entire contents of which are incorporated herein by reference.

BACKGROUND

JP 2000-331727A discloses an electrical junction box (substrate unit) including a case provided with a mounting portion including a stud bolt (external thread portion) protruding upwardly, in order to electrically connect a connection terminal of a wire harness to a bus bar. The external thread portion is fixed with its entire circumference being surrounded by the mounting portion (see FIG. 1 of JP 2000-331727A).

A substrate unit according to the present disclosure includes a case that accommodates a circuit board; a bus bar that is electrically connected to the circuit board, and includes an extending portion extending out of the case; and an external thread portion that electrically connects the extending portion to a connection terminal of a wire harness, the external thread portion including a shaft portion provided with an external thread, and a head portion that has a noncircular outside shape, and protrudes at one end portion of the shaft portion in a radial direction of the shaft portion. The case includes a fitting recess to which the head portion can be fitted by sliding the external thread portion in a direction intersecting an axial direction of the external thread portion, and that has an abutment surface by which the head portion is stopped in abutment, and, at least on the two sides of the abutment surface, relief recesses that define a gap together with the head portion.

DETAILED DESCRIPTION OF PREFERRED EMBODIMENTS

Figure 1:
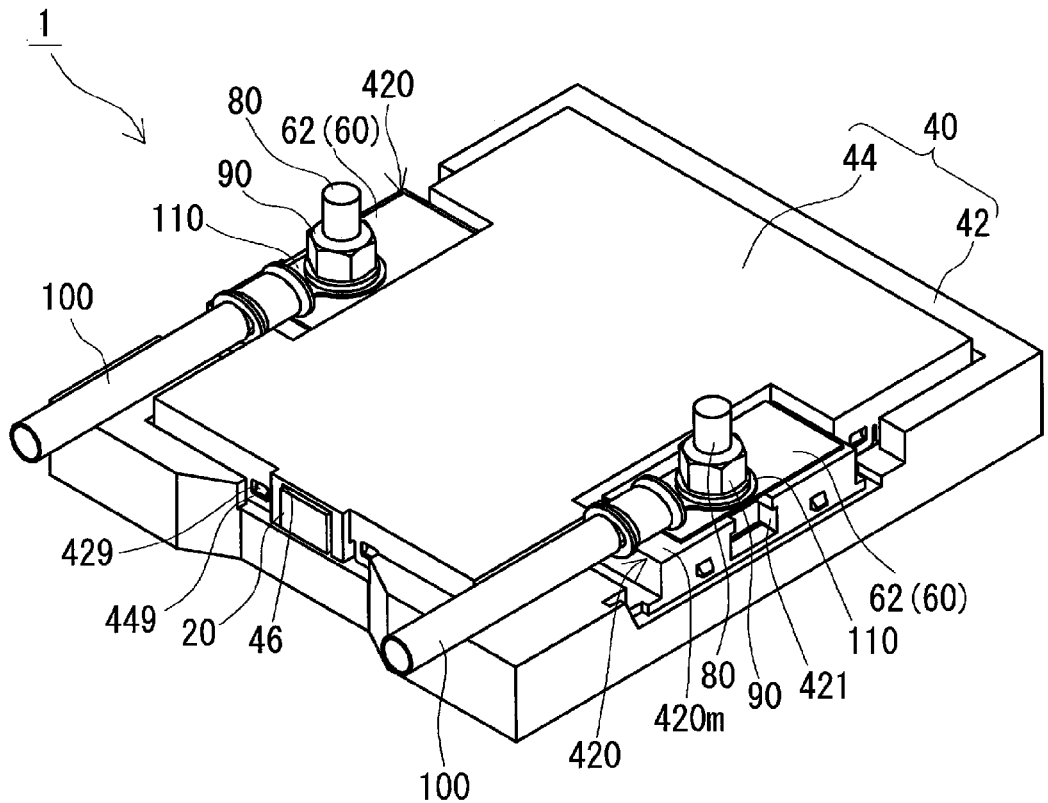
FIG. 1 is a schematic perspective view showing a substrate unit according to Embodiment 1.
Figure 2:
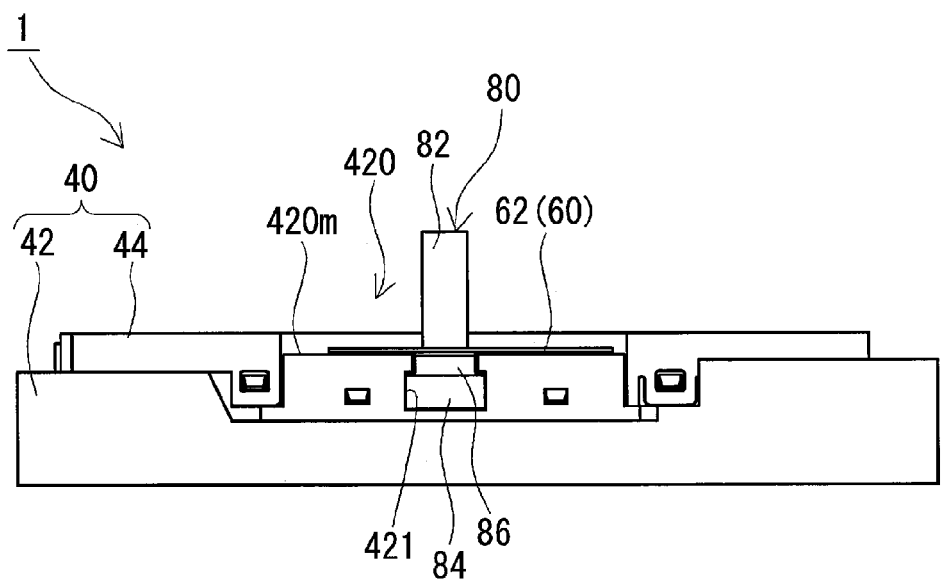
FIG. 2 is a schematic side view showing the substrate unit according to Embodiment 1.

Problem to be Solved by the Present Disclosure

The external thread portion may sometimes be fixed and inserted to the mounting portion (case) from a direction intersecting the axial direction of the external thread portion. In such a situation, the case is provided with a notch portion having an insertion port into which a head portion of the external thread portion is inserted in the direction intersecting the axial direction of the external thread portion. When the head portion of the external thread portion is inserted into the notch portion, the surface, located on the far side in the insertion direction, of the head portion of the external thread portion faces an abutment surface located at an end edge of the notch portion. However, the surface thereof located on the insertion port side does not face a surface constituting the case. Because it is necessary to smoothly fit the external thread portion to the notch portion, there is a clearance between opposing side surfaces of the head portion and the notch portion in the insertion direction. Then, as a nut rotates when being threadably engaged with the external thread portion, the head portion of the external thread portion rotates within the range of the clearance, pressing against the abutment surface located at an end edge of the notch portion, which may cause the external thread portion to be inclined into the space on the insertion port side, or to be even removed from the insertion port.

Therefore, it is an object of the present disclosure to provide a substrate unit capable of inhibiting the positional displacement of the external thread portion at the time of threadably engaging the nut with the external thread portion.

Advantageous Effects of the Present Disclosure

According to the present disclosure, it is possible to provide a substrate unit capable of suppressing the positional displacement of an external thread portion at the time of threadably engaging a nut to the external thread portion.

DESCRIPTION OF EMBODIMENTS OF THE PRESENT INVENTION

First, embodiments of the present invention will be listed and described.

A substrate unit according to an embodiment of the present invention includes: a case that accommodates a circuit board; a bus bar that is electrically connected to the circuit board, and includes an extending portion extending out of the case; and an external thread portion for electrically connecting the extending portion to a connection terminal of a wire harness, the external thread portion including a shaft portion provided with an external thread, and a head portion that has a noncircular outside shape, and protrudes at one end portion of the shaft portion in a radial direction of the shaft portion. The case includes a fitting recess to which the head portion can be fitted by sliding the external thread portion in a direction intersecting an axial direction of the external thread portion, and that has an abutment surface by which the head portion is stopped in abutment, and, on at least opposite sides of the abutment surface, relief recesses that define a gap together with the head portion.

The provision of the fitting recess on the case allows the external thread portion to be fitted to the case from a direction intersecting the axial direction thereof (hereinafter, fitting the external thread portion to the case from the direction intersecting the axial direction thereof is referred to as "lateral fitting"). For lateral fitting, when a nut is threadably engaged with the external thread portion fitted to the fitting recess, the rotational force of the nut is exerted to the head portion of the external thread portion, and pressing force may act on the abutment surface of the case due to the rotational torque caused by the rotational force. Since the head portion of the external thread portion is abutted against the abutment surface of the case, the repulsive force of the pressing force acting on the abutment surface acts on the head portion of the external thread portion. For lateral fitting, the surface of the head portion of the external thread portion that is located opposite to the abutment surface faces the space inside the fitting recess, and there is no opposing surface. Accordingly, the repulsive force acting on the head portion of the external thread portion may cause the external thread portion to be inclined into the space inside the fitting recess, or may further cause the fitting recess to be removed.

With the above-described configuration, the relief recesses are included at least on opposite sides of the abutment surface, and thereby, a gap is defined between the head portion of the external thread portion and the abutment surface. Accordingly, it is possible to inhibit pressing force from acting on the abutment surface with the rotational torque caused by rotation of the nut. Therefore, it is possible to inhibit the repulsive force of the pressing force from acting on the head portion of the external thread portion. Accordingly, even for lateral fitting, it is possible to inhibit the external thread portion from being positionally displaced relative to the fitting recess (case) or from being detached therefrom.

Note that for lateral fitting, a portion for retaining the external thread portion to the case can be easily molded integrally with the case. When a portion for retaining the external thread portion in the direction intersecting the axial direction of the external thread portion is molded on the case, the portion can serve to retain the external thread portion to the shaft portion. If the shaft portion is cylindrical, the sliding distance between the shaft portion and the retaining portion can be shortened. On the other hand, for longitudinal fitting in which the external thread portion is fitted to the case along the axial direction thereof, the retaining portion is molded on a head portion having a noncircular outside shape, and the sliding distance between the external thread portion and the retaining portion tends to be long.

An example of the above-described substrate unit may be an embodiment in which the head portion has a quadrangular outside shape, and the relief recesses are located in the vicinity of corners of the head portion.

Since the head portion of the external thread portion has a quadrangular shape, the rotation of the external thread portion can be easily limited by contact with the inner peripheral surface of the fitting recess. When the head portion of the external thread portion has a quadrangular shape, the rotational torque caused by the rotation of the nut is likely to exert pressing force on the abutment surface in the vicinity of corners of the head portion. Accordingly, by the relief recesses being located in the vicinity of corners of the head portion, it is possible to effectively inhibit pressing force from acting on the abutment surface with the rotational torque caused by rotation of the nut.

An example of the above-described substrate unit may be an embodiment in which the case includes, on a side opposite to the abutment surface across the external thread portion, a holding portion that holds the external thread portion at a predetermined position.

With the above-described configuration, it is possible, with the holding portion, to inhibit the external thread portion from being inclined to the opening side of the fitting recess that is opposite to the abutment surface, or inhibit the external thread portion from being removed from the fitting recess.

An example of the above-described substrate unit may be an embodiment in which the fitting recess includes, in the vicinity of an opening on a side opposite to the abutment surface, a portion extending outwardly relative to the abutment surface side.

With the above-described configuration, the fitting recess has a wide area in the vicinity of the opening, and, therefore, the head portion of the external thread portion can be easily placed in the fitting recess.

DETAILS OF EMBODIMENTS OF THE PRESENT INVENTION

Hereinafter, a substrate unit according to an embodiment of the present invention will be described with reference to the drawings. In the drawings, the same reference numerals denote the same components.

Embodiment 1

A substrate unit 1 according to Embodiment 1 will be described with reference to FIGS. 1 to 8. The substrate unit 1 of Embodiment 1 includes a case 40 that accommodates a circuit board 10 (FIG. 3), a bus bar 60 that is electrically connected to the circuit board 10, and external thread portions 80 that electrically connect the bus bar 60 to a connection terminal 110 of a wire harness 100. The bus bar 60 includes extending portions 62 extending to the outside of the case 40, and the extending portions 62 and the connection terminal 110 (FIG. 1) are electrically connected to each other. The external thread portion 80 is mounted to the case 40. A main feature of the substrate unit 1 of Embodiment 1 lies in that the case 40 includes fitting recesses 421 to which a head portion 84 of the respective external thread portion 80 can be fitted by the external thread portion 80 sliding in a direction intersecting the axial direction thereof, and a positional displacement prevention structure that prevents positional displacement of the external thread portion 80 as a nut 90 is rotated when fastening the nut 90 to the external thread portion 80. In the following, each of the components will be described in detail first, and thereafter a method for mounting the external thread portion to the case and the behavior of the external thread portion when fastening the nuts to the external thread portions will be described.

External Thread Portion

Figure 3:
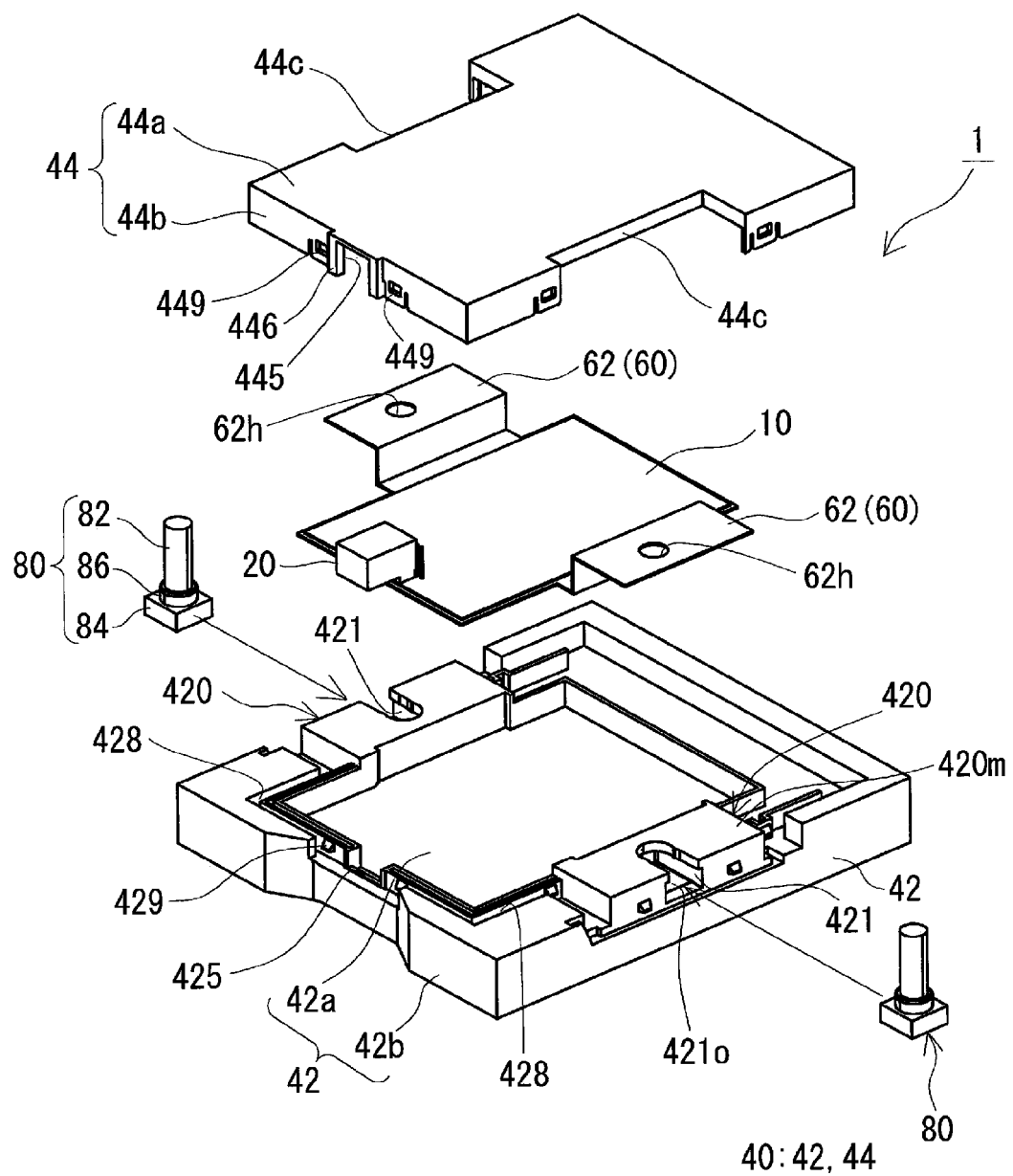
FIG. 3 is a schematic exploded perspective view showing the substrate unit according to Embodiment 1.

As shown in FIG. 3, the external thread portion 80 includes a shaft portion 82 provided with an external thread (not shown), and a head portion 84 that protrudes at one end portion of the shaft portion 82 in the radial direction of the shaft portion 82. The head portion 84 has a noncircular outside shape, which is not particularly limited as long as it is a shape that can limit the rotation of the external thread portion 80 by contact with an inner peripheral surface, which will be described later, of the fitting recess 421. Examples of the outside shape of the head portion 84 of the external thread portion 80 as viewed from the axial direction include polygonal shapes including a quadrangular shape. In the present example, the external thread portion 80 includes an intermediate portion 86 that constitutes the outer circumference of the shaft portion 82 and extends continuously with the head portion 84. The intermediate portion 86 has a diameter slightly larger than that of the shaft portion 82.

Case

As shown in FIGS. 1 and 3, the case 40 is composed of a lower case 42 that is open to the top and an upper cover 44 that covers the opening of the lower case 42. A circuit board 10, a connector portion 20 that is implemented on the circuit board 10, and a bus bar 60 (the details of which will be described later) that is electrically connected to the circuit board 10 are housed in the internal space defined by putting the lower case 42 and the upper cover 44 together. The bus bar 60 includes extending portions 62 extending to the outside of the case 40, and the case 40 includes foundation portions 420 having placement surfaces 420m on which the extending portions 62 are placed. A feature of the substrate unit 1 of Embodiment 1 lies in that the foundation portions 420 included in the case 40 each include a fitting recess 421 to which an external thread portion 80 is mounted, and a relief recess 422 (FIGS. 4 and 5) serving as a positional displacement prevention structure for the external thread portion 80. In the following description, the side of the substrate unit 1 that is located toward the lower case 42 of the case 40 is referred to as "lower side", and the side thereof located toward the upper cover 44 is referred to as "upper side". In addition, in a direction that is orthogonal to the up-down direction of the case 40, the side on which the connector portion 20 is disposed is referred to as "front side" and the opposite side thereof is referred to as "rear side". The direction that is orthogonal to both the up-down direction and the front-rear direction is referred to as "left-right direction".

Lower Case

As shown in FIG. 3, the lower case 42 is composed of a flat plate-shaped bottom portion 42a on which the circuit board 10 and a part of the bus bar 60 are placed, and a substantially rectangular frame-shaped, side wall portion 42b slightly rising from the peripheral edge of the bottom portion 42a. The lower case 42 has a substantially rectangular box shape that is open on the side (upper side) opposite to the bottom portion 42a. The bottom portion 42a and the side wall portion 42b may be molded in one piece, or may be separate members that are put together with a fixing member such as a bolt, instead of being molded in one piece.

The bottom portion 42a has a rectangular shape somewhat larger than the circuit board 10, and is constituted by a heat sink that dissipates heat generated from electronic components mounted on the circuit board 10. As the bottom portion 42a, it is possible to use, for example, a highly thermally conductive metal plate such as an aluminum or copper plate that is provided with insulating coating.

As shown in FIG. 3, the side wall portion 42b is a frame extending continuously along the entire perimeter of the bottom portion 42a, and covers four sides of the periphery of the circuit board 10, including the connector portion 20. The side wall portion 42b includes, at a part constituting the frame portion, foundation portions 420 each having a placement surface 420m on which the extending portion 62 of the bus bar 60 is placed.

Foundation Portion

The foundation portions 420 are provided on the left and right sides of the case 40, and each constitute a mounting portion to which the external thread portion 80 is mounted and include a fitting recess 421 and relief recesses 422. The upper surface of each of the foundation portions 420 constitutes a rectangular placement surface 420m somewhat larger than the extending portion 62 of the bus bar 60, and a fitting recess 421 that is open laterally and upwardly so as to allow the external thread portion 80 to protrude upwardly is formed at the central part of the foundation portion 420. The external thread portion 80 is placed into the fitting recess 421 by sliding from a lateral side of the case 40 in a direction orthogonal to its axial direction.

Fitting Recess

Figure 4:
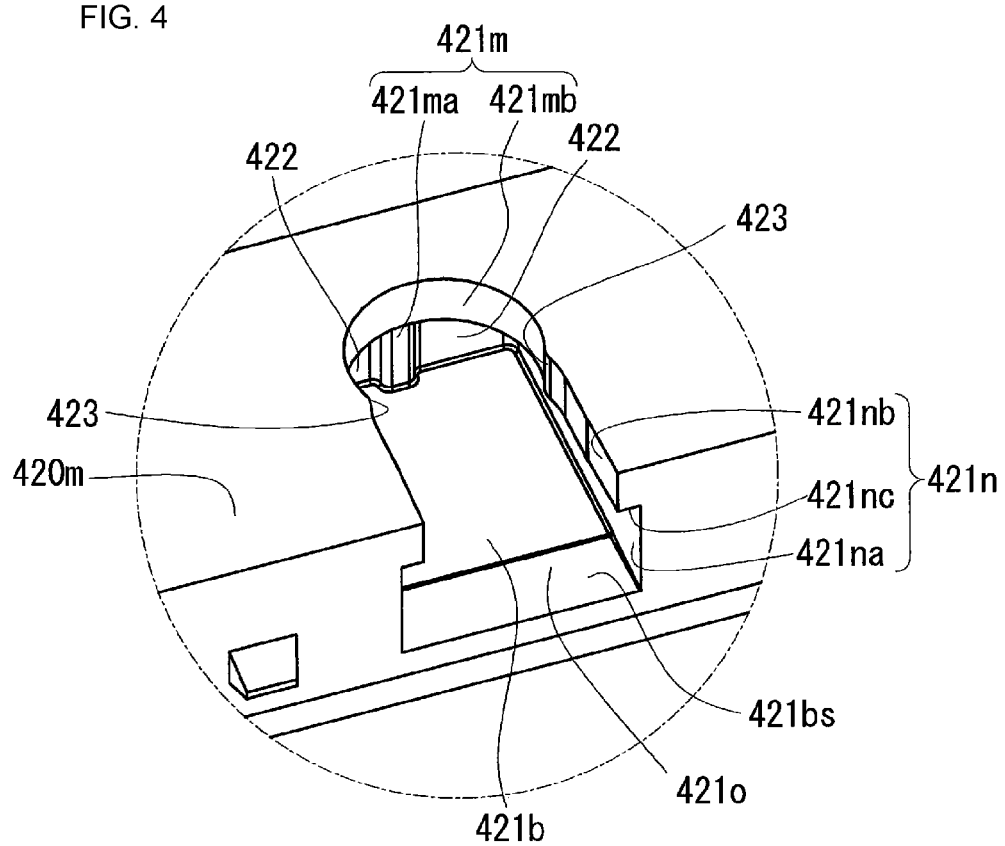
FIG. 4 is a schematic perspective view showing the vicinity of a mounting portion for an external thread portion in a case included in the substrate unit according to Embodiment 1.

As shown in FIG. 4, the fitting recess 421 includes a bottom surface 421b parallel to the placement surface 420m, side surfaces 421n and 421n and an abutment surface 421m that connect the bottom surface 421b with the placement surface 420m, and an insertion port 421o for the head portion 84 of the external thread portion 80 on the side opposing the abutment surface 421m. When the head portion 84 of the external thread portion 80 is inserted from the insertion port 421o and slid within the fitting recess 421, an end face of the head portion 84 is stopped in abutment by the abutment surface 421m. That is, the external thread portion 80 can be placed in a predetermined position of the foundation portion 420 by the head portion 84 being pushed so as to be stopped in abutment by the abutment surface 421m.

In the present example, the side surfaces 421n of the fitting recess 421 include lower side surfaces 421na on the bottom surface 421b side, upper side surfaces 421nb on the placement surface 420m side, and stepped surfaces 421nc between the lower side surfaces 421na and the upper side surfaces 421nb. The width between the lower side surfaces 421na is wider than the width between the upper side surfaces 421nb. Similarly, the abutment surface 421m of the fitting recess 421 includes a lower abutment surface 421ma on the bottom surface 421b side, an upper abutment surface 421mb on the placement surface 420m side, and a stepped surface (not shown) between the lower abutment surface 421ma and the upper abutment surface 421mb.

The space defined by the lower side surfaces 421na, the lower abutment surface 421ma, and the bottom surface 421b serves as a slide path for the head portion 84 of the external thread portion 80. That is, the head portion 84 of the external thread portion 80 is stopped in abutment by the lower abutment surface 421ma. The width between the opposing lower side surfaces 421na and 421na is wide enough to allow the head portion 84 of the external thread portion 80 to slide (see FIG. 8). When the fitting recess 421 has a portion widening outward in the vicinity of the insertion port 421o, the external thread portion 80 can be easily inserted into the insertion port 421o. In the present example, a portion of the bottom surface 421b that is located in the vicinity of the insertion port 421o is formed as an inclined surface 421bs that downwardly extends toward the insertion port 421o. Apart from the inclined surface 421bs, a portion of the lower side surface 421na that is located in the vicinity of the insertion port 421o may be formed such that the width between the lower side surfaces 421na becomes wider toward the insertion port 421o.

On the other hand, the space defined by the upper side surfaces 421nb and the upper abutment surface 421mb serves as a slide path for the intermediate portion 86 of the external thread portion 80. The upper abutment surface 421mb has an arc shape corresponding to the outer circumference of the intermediate portion 86 of the external thread portion 80. The intermediate portion 86 of the external thread portion 80 is stopped in abutment by the upper abutment surface 421mb. The width between the upper side surfaces 421nb is wide enough to allow the intermediate portion 86 of the external thread portion 80 to slide (see FIG. 7). In the present example, a portion of each of the upper side surfaces 421nb that is located in the vicinity of the insertion port 421o widens outwardly such that the width between the upper side surfaces 421nb becomes larger towards the insertion port 421o.

The stepped surfaces 421nc between the lower sides surface 421na and the upper side surfaces 421nb, and the stepped surface between the lower abutment surface 421ma and the upper abutment surface 421mb are in contact with the upper surface of the head portion 84 of the external thread portion 80.

Relief Recess

Figure 5:
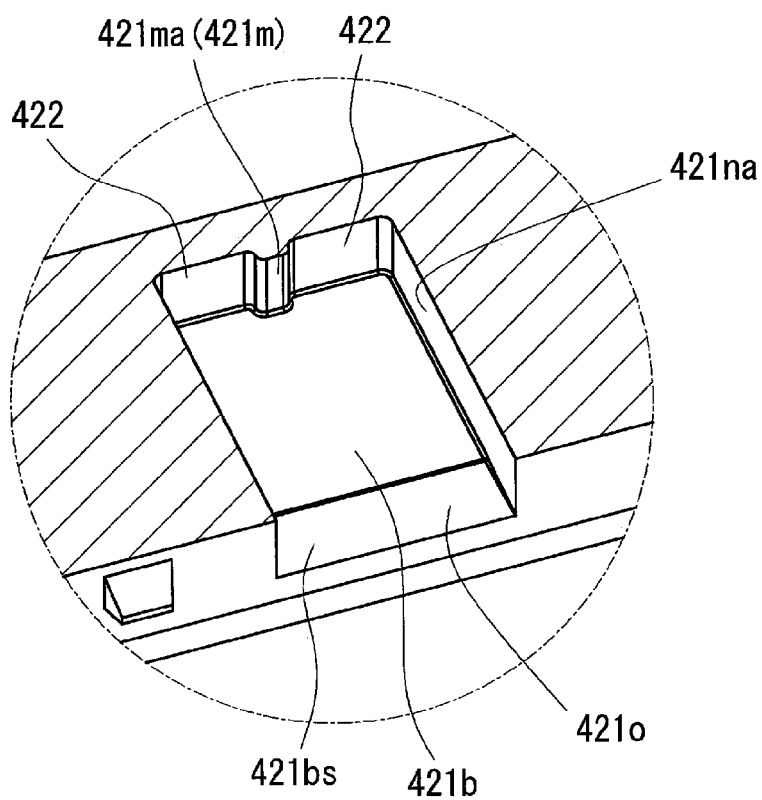
FIG. 5 is a schematic cross-sectional perspective view showing the vicinity of the mounting portion for an external thread portion in the case included in the substrate unit according to Embodiment 1.
Figure 8:
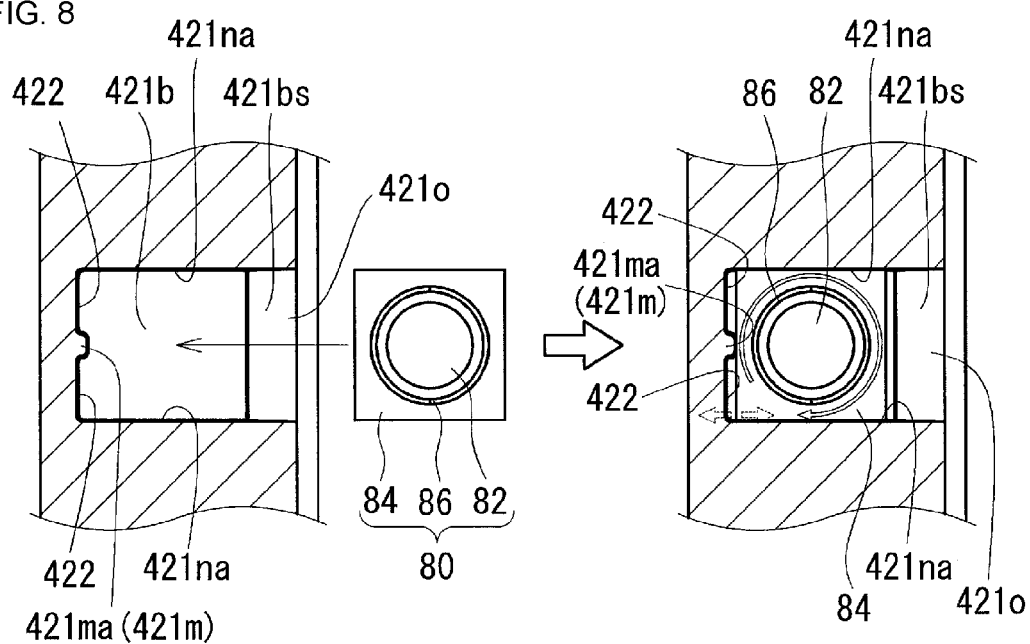
FIG. 8 is a schematic explanatory diagram illustrating mounting of an external thread portion to the mounting portion for an external thread portion in the case included in the substrate unit of Embodiment 1.

At least on the two sides of the abutment surface 421m (lower abutment surface 421ma), the abutment surface 421m incudes relief recesses 422 that define a gap between the relief recesses 422 and the head portion 84 of the external thread portion (see FIGS. 4, 5, and 8). The relief recesses 422 are disposed in the vicinity of corners of the head portion 84 of the external thread portion 80. In the present example, the relief recesses 422 and 422 are formed in portions other than the central part of the abutment surface 421m.

Each relief recess 422 has a depth deep enough to bring the head portion 84 of the external thread portion 80 and the abutment surface 421m (the lower abutment surface 421ma) in a non-contact state, and inhibit pressing force from acting on the abutment surface 421m with the rotational torque of the head portion 84. The behavior of the external thread portion 80 caused by the rotational torque of the external thread portion 80 will be described in detail later. To enable the head portion 84 of the external thread portion 80 to slide in the fitting recess 421, a gap (the gap with the side surfaces 421n is a total gap of the gaps on the opposite sides) is provided between the inner peripheral surface (side surface 421n) of the fitting recess 421 and the head portion 84 of the external thread portion 80.

Holding Portion

Figure 6:
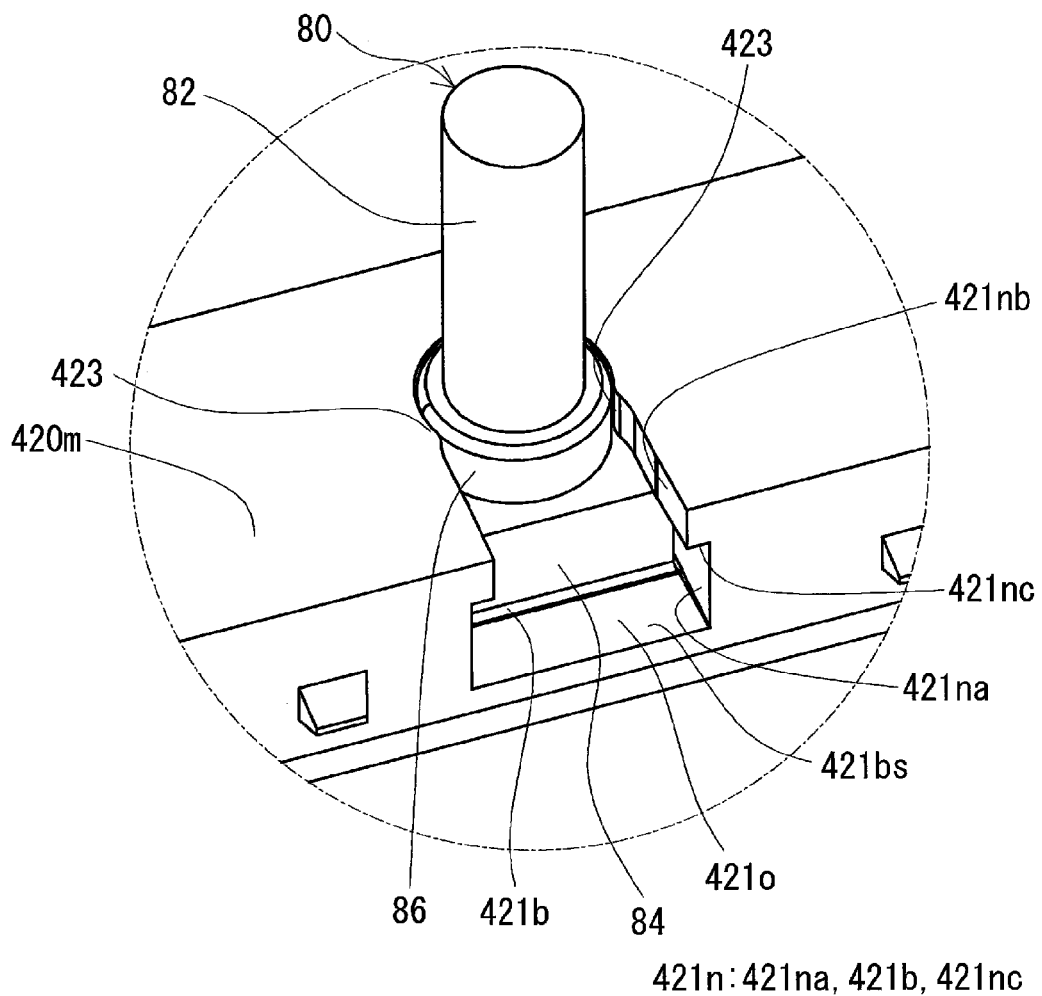
FIG. 6 is a schematic perspective view showing a state in which an external thread portion is mounted to the mounting portion for an external thread portion of the case included in the substrate unit according to Embodiment 1.

As shown in FIGS. 4 and 6, the upper side surfaces 421nb include holding portions 423 that hold the external thread portion 80 at a predetermined position of the abutment surface 421m. The holding portions 423 are constituted by protruding portions that are formed across the external thread portion 80 between the abutment surface 421m and the opening (insertion port 421o) on the opposite side such that the width between the upper side surfaces 421nb is locally reduced to be smaller than the outer diameter of the intermediate portion 86 of the external thread portion 80 (see FIG. 6). If the foundation portions 420 (case 40) are made of resin whereas the external thread portion 80 is made of metal, sliding the external thread portion 80 and pushing it into the fitting recess 421 causes the intermediate portion 86 of the external thread portion 80 to move over the holding portion 423 so as to be held at a predetermined position.

Other Components

In addition to the foundation portions 420 for the external thread portion 80, the side wall portion 42b includes a lower-side recess 425 (FIG. 3) at the front central part of the case 40. The lower-side recess 425, together with an upper-side recess 445, which will be described later, of the upper cover 44, defines an opening 46 (FIG. 1) in which the connector portion 20 is disposed. The size of the lower-side recess 425 may be selected as appropriate so as to allow the connector portion 20 to be disposed in the opening 46 defined by the lower-side recess 425 and the upper-side recess 445, and allow the connector portion 20 to be positioned relative to the case 40.

As shown in FIG. 3, the side wall portion 42b includes, at a portion in the circumferential direction of the upper surface, insertion grooves 428 into which the side wall portion 44b of the upper cover 44 is inserted, and an engaging portion (engaging projection 429) to which the side wall portion 44b of the upper cover 44 inserted into the insertion grooves 428 is fixed. The insertion grooves 428 may be formed in conformity to the shape of the side wall portion 44b of the upper cover 44. The engaging projection 429 may be provided at suitable positions in the circumferential direction of the side wall portion 42b, and is provided on the side wall portion 42b on the front side or the side wall portions 42b on the left and right sides.

The lower case 42 can be made of a synthetic resin such as polypropylene (PP) or polyamide (PA).

Upper Cover

As shown in FIG. 3, the upper cover 44 is a unitary member that covers the opening of the lower case 42, and is composed of a flat plate-shaped ceiling portion 44a constituting the upper surface of the case 40, and substantially rectangular frame-shaped, side wall portions 44b provided so as to rise slightly from the peripheral edge of the ceiling portion 44a. The upper cover 44 is fixed to and integrated with the lower case 42 by the side wall portions 44b being inserted into the insertion grooves 428 of the lower case 42, and the engaging projections 429 of the lower case 42 being engaged with engaging holes 449 provided in the side wall portions 44b.

The upper cover 44 is formed in a shape that covers the top of the lower case 42 with the foundation portions 420 of the lower case 42 being exposed, and the upper cover 44 includes notch portions 44c at a portion of its outer wall. The notch portions 44c make it possible to reliably provide a gap through which the extending portions 62 of the bus bar 60 can be passed even when the upper cover 44 is fixed to the lower case 42. This gap allows the extending portion 62 of the bus bar 60 to be placed on the placement surface 420m of the foundation portion 420.

The side wall portion 44b includes an upper-side recess 445 at the front central part of the case 40. The upper-side recess 445 defines, together with the lower-side recess 425 of the lower case 42, an opening 46 in which the connector portion 20 is disposed. In the present example, the connector portion 20 is disposed such that the distal end side thereof is exposed to the outside of the case 40. The side wall portion 44b includes a protruding portion 446 that protrudes outwardly so as to cover the exposed part of the connector portion 20. An end face of the protruding portion 446 that surrounds the upper side and both lateral sides of the connector portion 20 has an inverted U-shape.

Similarly to the lower case 42, the upper cover 44 may be formed of a synthetic resin such as polypropylene (PP) or polyamide (PA).

As shown in FIG. 3, the circuit board 10 that is housed inside the case 40 is a substantially rectangular printed circuit board disposed on a bus bar 60, which will be described later, and including a conductive pattern (not shown) formed on a surface opposite to the surface on which the bus bar 60 is placed. The conductive path constituted by the conductive pattern is a control conductive path (part of the circuit). Electronic components (not shown) such as a switching element and the connector portion 20 are implemented on the circuit board 10. The mating side connector portion (not shown) such as an external control apparatus is connected to the connector portion 20.

Bus Bar

The bus bar 60 is a plate-shaped member constituting a power circuit. The bus bar 60 is composed of a plurality of bus bar pieces, which are arranged in a predetermined layout. The bus bar 60 includes a body portion on which the circuit board 10 is disposed, and extending portions 62 that are formed in one piece with the body portion and extend to the outside of the case 40, protruding from the body portion and bent in a stepped manner. The extending portions 62 are disposed on the placement surface 420*m* of the foundation portion 420 in the lower case 42 (see FIGS. 1 and 2). A through hole 62*h* through which the external thread portion 80 is inserted is formed in the extending portions 62. The bus bar 60 is electrically connected to the wire harness 100 via the external thread portion 80 by the external thread portion 80 being inserted through the through hole 62*h*, and the connection terminal 110 of the wire harness 100 being mounted to the external thread portion 80.

Method for Mounting External Thread Portion to Case

Figure 7:
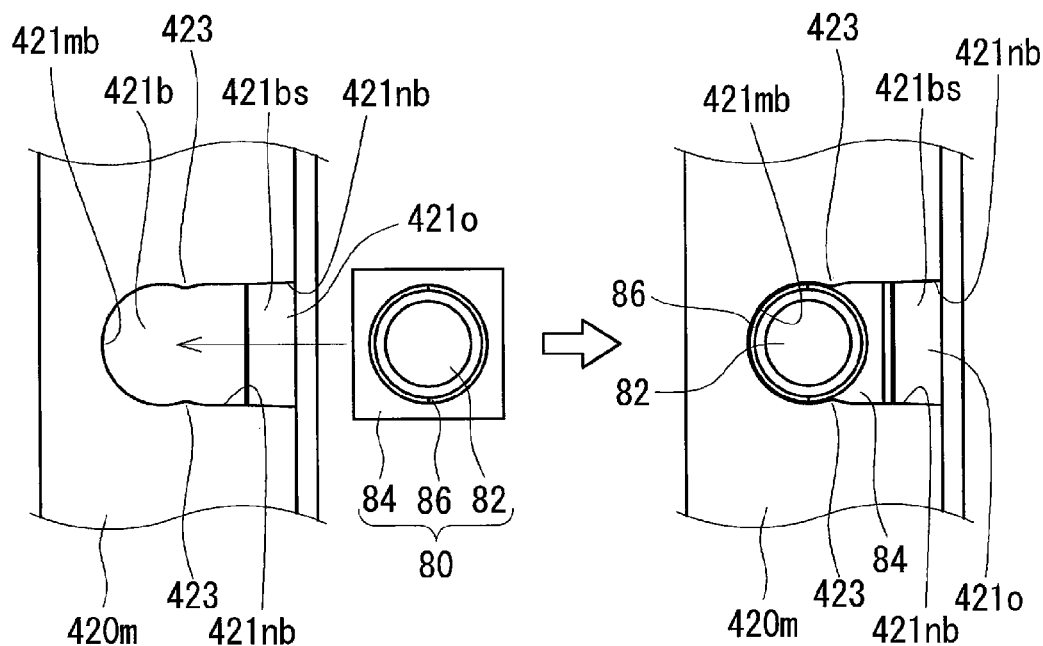
FIG. 7 is a schematic explanatory diagram illustrating mounting of an external thread portion to the mounting portion for an external thread portion in the case included in the substrate unit according to Embodiment 1.

A method for mounting the external thread portion 80 to the case 40 in the substrate unit 1 having the above-described configuration will be described with reference to FIGS. 7 and 8. The external thread portion 80 is inserted to the insertion port 421*o* of the fitting recess 421 from a direction orthogonal to the axial direction thereof, and is slid within the fitting recess 421. Specifically, the head portion 84 of the external thread portion 80 slides in the space defined by the lower side surfaces 421*na*, the lower abutment surface 421*ma*, and the bottom surface 421*b* of the fitting recess 421 (see the left drawing in FIG. 8), and the intermediate portion 86 of the external thread portion 80 slides in the space defined by the upper side surfaces 421*nb* and the upper abutment surface 421*mb* (see the left drawing in FIG. 7). The head portion 84 of the external thread portion 80 is stopped in abutment by the lower abutment surface 421*ma* (see the right drawing in FIG. 8), and the intermediate portion 86 of the external thread portion 80 is stopped in abutment by the upper abutment surface 421*mb* (see the right drawing in FIG. 7), and, thereby, the external thread portion 80 is disposed at a predetermined position. At this time, as the result of the intermediate portion 86 of the external thread portion 80 moving over the holding portions 423 formed on the upper side surfaces 421*nb*, the external thread portion 80 is held at a predetermined position on the abutment surface 421*m* side.

Thereafter, the external thread portion 80 fitted to the fitting recess 421 is passed through the through hole 62*h* formed in the extending portion 62 of the bus bar 60, thus placing the extending portion 62 on the placement surface 420*m*. After the circuit board 10, the connector portion 20, and the bus bar 60 have been accommodated in the lower case 42, the lower case 42 and the upper cover 44 are engaged with each other by sandwiching the connector portion 20 between the lower-side recess 425 of the lower case 42 and the upper-side recess 445 of the upper cover 44, thus obtaining a substrate unit 1.

The connection of the wire harness 100 to the substrate unit 1 can be achieved by passing the external thread portion 80 through the through hole of the connection terminal 110 connected to an end portion of the wire harness 100, and threadably engaging the nut 90 with the external thread portion 80 (see FIG. 1).

Behavior of External Thread Portion at the Time of Threadably Engaging Nut with External Thread Portion The behavior of the external thread portion 80 when the nut 90 is threadably engaged with the external thread portion 80 fitted to the fitting recess 421 including the relief recesses 422 will be described with reference to FIG. 8. When the nut 90 (FIG. 1) is threadably engaged with the external thread portion 80 fitted to the fitting recesses 421, the rotational force of the nut 90 is exerted to the head portion 84 of the external thread portion 80. The clockwise outlined arrow shown in the right drawing in FIG. 8 indicates the direction of rotation of the nut 90. The rotational torque caused by the rotational force tends to exert pressing force on the abutment surface 421*m* in the vicinity of corners of the head portion 84. Of the dot-outlined arrows shown in the right drawing in FIG. 8, the arrow extending from the head portion 84 side of the external thread portion 80 toward the abutment surface 421*m* side indicates the direction of the pressing force acting on the abutment surface 421*m* side of the head portion 84 by the rotational force. If the relief recesses 422 are provided in the region of the abutment surface 421*m* that opposes the head portion 84, the above-described pressing force will not act on the abutment surface 421*m*. Therefore, the repulsive force (the direction of the arrow extending from the abutment surface 421*m* side toward the head portion 84 side of the external thread portion 80 of the dot-outlined arrows shown in the right drawing in FIG. 8) of the pressing force acting on the abutment surface 421*m* also will not act on the head portion 84. Accordingly, no force other than the rotational force of the nut 90 will act on the external thread portion 80, thus making it possible to inhibit the external thread portion 80 from being displaced from the predetermined position. Even if rotational force acts on the head portion 84 of the external thread portion 80, the rotation of the head portion 84 is limited by contact with the inner peripheral surface of the fitting recess 421 due to the noncircular shape of the head portion 84, and therefore, the external thread portion 80 will not rotate with the rotation of the nut 90.

Figure 9:
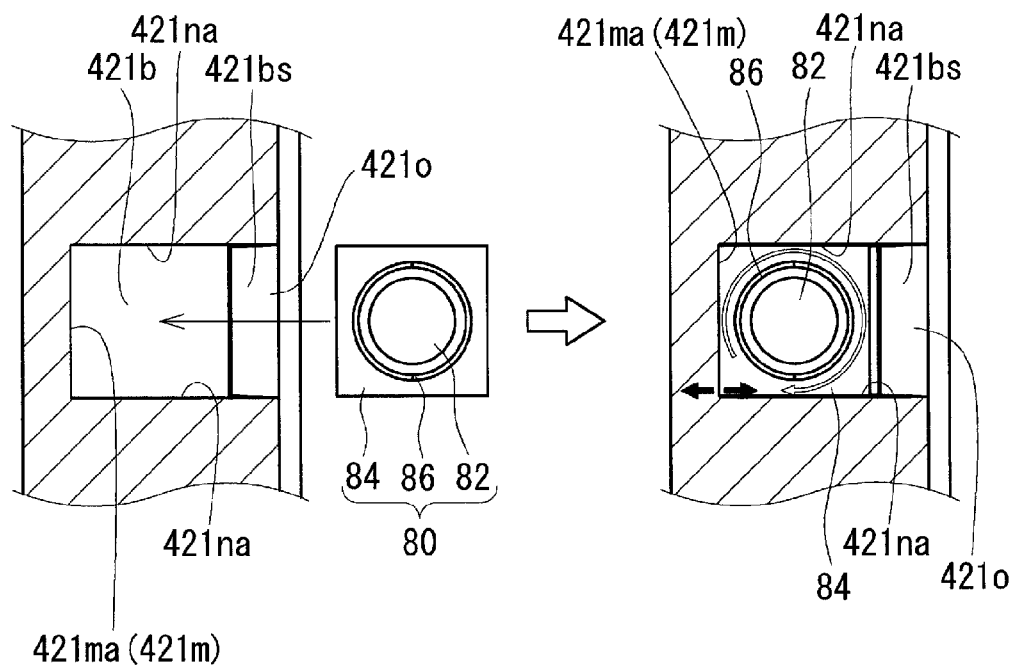
FIG. 9 is schematic explanatory diagram illustrating mounting of an external thread portion in a case where a relief recess is not included in the mounting portion for an external thread portion in the case included in the substrate unit.

On the other hand, the behavior of the external thread portion 80 when the nut 90 is threadably engaged with an external thread portion 80 fitted to a fitting recess 421 having an abutment surface 421*m* including no relief recess will be described with reference to FIG. 9. The head portion 84 and the abutment surface 421*m* come into abutment when no relief recess 422 is provided, and therefore, a pressing force acts on the abutment surface 421*m* in the vicinity of corners of the head portion 84 (the direction of the arrow extending from the head portion 84 side of the external thread portion 80 toward the abutment surface 421*m* side of the solid arrows shown in the right drawing in FIG. 9). Since the abutment surface 421*m* and the head portion 84 are in abutment, the repulsive force of the pressing force acting on the abutment surface 421*m* acts on the head portion 84 (the direction of the arrow extending from the abutment surface 421*m* side toward the head portion 84 side of the external thread portion 80 of the solid arrows shown in the right drawing in FIG. 9). When the above-described repulsive force acts on the head portion 84, the external thread portion 80, in particular, the head portion 84 is inclined to the insertion port 421*o* side, which is located opposite to the abutment surface 421*m*. The external thread portion 80 is to be held at a predetermined position by the holding portion 423 (see the right drawing in FIG. 7). However, when the holding portion 423 is made of resin whereas the external thread portion 80 is made of metal, the intermediate portion 86 of the external thread portion 80 may move over the holding portion 423 toward the insertion port 421o side, thus causing the external thread portion 80 to be removed from the fitting recess 421.

Effects

The substrate unit 1 described above includes the relief recesses 422 on opposite sides of the abutment surface 421m against which the head portion 84 of the external thread portion 80 comes into abutment, thus making it possible to inhibit the rotational torque caused by rotation of the nut 90 from causing pressing force to act on the abutment surface 421m in the vicinity of corners of the head portion 84, and inhibit the repulsive force of the pressing force from acting on the head portion 84. Therefore, even for lateral fitting in which the external thread portion 80 is fitted to the foundation portion (mounting portion) 420 of the case 40 from a direction orthogonal to the axial direction thereof, it is possible to inhibit the external thread portion 80 from being positionally displaced or removed.

In the substrate unit 1 described above, the relief recesses 422 are formed in a region where the pressing force by the rotational torque is exerted. Therefore, it is possible to inhibit the positional displacement of the external thread portion 80 with a simple configuration, without additionally providing a positional displacement prevention member as a member separate from the case 40.

The present invention is defined by the claims, rather than being limited to the above-described examples, and intended to include all modifications which fall within the scope of the claims and the meaning and scope of equivalents thereof. For example, the specifications (size, shape, etc.) of the external thread portion, the size and shape of the fitting recess or the relief recess may be changed.

The invention claimed is:

1. A substrate unit comprising:
    a case that accommodates a circuit board;
    a bus bar that is electrically connected to the circuit board, and includes an extending portion extending out of the case; and
    a bolt for electrically connecting the extending portion to a connection terminal of a wire harness, the bolt including a shaft portion, and a head portion that has a noncircular outside shape, and protrudes at one end portion of the shaft portion in a radial direction of the shaft portion, wherein
    the case includes:
    a placement surface opposite and spaced apart from a bottom surface, a back surface, and a pair of lower side surfaces connected together to define a fitting recess having an insertion port to which the head portion can be fitted by sliding the bolt through the insertion port in a direction intersecting an axial direction of the bolt, and an abutment surface disposed on the back surface by which the head portion is stopped in abutment, and,
    at least on the two sides of the abutment surface, relief recesses that define a gap between the back surface and the head portion.

2. The substrate unit according to claim 1, wherein the head portion has a quadrangular outside shape, and
    the relief recesses are located in a region of corners of the head portion.

3. The substrate unit according to claim 1, wherein the case includes, on a side opposite to the abutment surface across the bolt, a holding portion that holds the bolt at a predetermined position.

4. The substrate unit according to claim 1, wherein the fitting recess includes, in a region of an opening on a side opposite to the abutment surface, a portion widening outwardly relative to the abutment surface side.

5. The substrate unit according to claim 2, wherein the case includes, on a side opposite to the abutment surface across the bolt, a holding portion that holds the bolt at a predetermined position.

6. The substrate unit according to claim 2, wherein the fitting recess includes, in the region of an opening on a side opposite to the abutment surface, a portion widening outwardly relative to the abutment surface side.

7. The substrate unit according to claim 3, wherein the fitting recess includes, in the region of an opening on a side opposite to the abutment surface, a portion widening outwardly relative to the abutment surface side.

* * * * *